United States Patent Office 3,382,053
Patented May 7, 1968

3,382,053

TANTALUM FILMS OF UNIQUE STRUCTURE

Carl Altman, Kendall Park, and Mildred Hoogstraat Read, Summit, N.J.; said Altman assignor to Western Electric Company, Incorporated, and said Read assignor to Bell Telephone Laboratories, Incorporated, both of New York, N.Y., both corporations of New York No Drawing. Filed Apr. 5, 1965, Ser. No. 448,553
12 Claims. (Cl. 29—194)

ABSTRACT OF THE DISCLOSURE

Beta tantalum is a heretofore unknown tantalum material which has a different crystalline structure than the body-centered cubic crystalline structure of normal tantalum. The crystalline structure of beta tantalum is defined by the following *d*-spacings in angstrom units: 5.38, 4.75, 2.67, 2.49, 2.36, 2.32, 2.15, 2.06, 1.77, 1.442, 1.405, 1.332, 1.240, 1.210, and 1.172. Beta tantalum also has different properties than normal tantalum such as a specific resistivity in excess of 160 micro-ohm-cm. and a temperature coefficient of resistance of from +100 p.p.m./° C. to −100 p.p.m./° C.

This invention relates to a novel tantalum film exhibiting useful properties not observed in normal tantalum films of body-centered cubic crystal structure. This novel tantalum film has particular utility in the manufacture of thin-film resistors, thin-film capacitors, and integrated thin-film circuits.

Electronic systems, particularly those in the communications industry, are rapidly becoming larger and more complex. With the development of increasingly more complicated electronic systems, the number of circuit components and necessary interconnections has increased many times over. The failure of even one component or of one lead connection can mean the failure of an entire system and an accompanying loss of service. Accordingly, components and interconnection techniques meeting reliability requirements of small systems may not be sufficiently reliable when connected in vast quantities in large, modern electronic systems.

Extensive research effort has been directed toward producing circuits and circuit elements which are reliable and stable in use and retain these characteristics over prolonged life periods. The tantalum integrated thin-film circuitry technology has evolved in response to this need.

Utilization of the thin-film technology inherently permits a substantial reduction in individual lead connections with accompanying increase in reliability. This reduction in individual lead connections is possible because a plurality of circuit components can frequently be formed on a single substrate from a single continuous film or from adjacent film layers inherently interconnecting the components. If the circuit components thus interconnected have the required reliability and stability, highly reliable and stable electronic systems can be built in this manner.

The stability and reliability of thin-film circuit components and therefore thin-film circuits depend to a considerable extent upon the material used to form the thin films. For this reason, there is a great need to find new materials for forming improved thin-film circuit elements. New tantalum materials permitting even further improvement in tantalum thin-film component stability and reliability are particularly desirable.

It is therefore an object of this invention to provide a new tantalum film possessing useful properties.

A further object of the invention is to provide a new tantalum film on a substrate useful in fabricating improved thin-film circuitry.

Another object of this invention is to provide a new tantalum film useful in fabricating thin-film capacitors having a high degree of reliability and stability.

It is an additional object of this invention to provide a new tantalum film useful in fabricating temperature stable, improved thin-film resistors of high resistance value.

It is a further object of this invention to provide a new tantalum film useful in fabricating integrated thin-film circuits possessing improved stability and reliability.

This invention contemplates a novel tantalum film having a unique structure and exhibiting useful properties not observed in a film of tantalum having the normal, body-centered cubic crystal structure. This novel tantalum film is most readily distinguished from a film of normal tantalum and from known tantalum compounds by its unique crystal structure, which may be observed by X-ray diffraction or electron diffraction. In conventional notation, this structure is characterized by the following *d*-spacings in angstrom units: 5.38, 4.75, 2.67, 2.49, 2.36, 2.32, 2.15, 2.06, 1.77, 1.485, 1.442, 1.405, 1.332, 1.240, 1.210 and 1.172 angstroms.

Other properties such as increased reflectivity, smoother surface characteristics, high specific resistivity, and low temperature coefficient of resistivity also distinguish this novel tantalum film from a normal tantalum.

The term "beta tantalum" has been coined to identify the novel tantalum film of this invention.

As mentioned above, beta tantalum is most readily distinguished from normal tantalum by its crystal structure which may be observed, for example, by X-ray diffraction techniques.

An X-ray diffraction pattern for a given material is represented in conventional notation by a listing of *d*-spacings for the material in decreasing order of magnitude usually expressed in angstrom units. Each *d*-spacing of a particular material is the distance in angstrom units between individual crystal planes in a given set of parallel crystal planes.

As is well known, the term "*d*-spacing" derives from Bragg's law, $\lambda = 2d \sin \theta$, where ($\lambda$) is the wavelength of the radiation reflected by parallel crystal planes, ($\theta$) is the angle of incidence (or reflection) of the radiation, and ($d$) is the distance between the parallel crystal planes.

As each crystalline material has a unique X-ray diffraction pattern, comparison of the X-ray diffraction pattern of an unknown material with the X-ray diffraction patterns for known materials, for example as listed in published powder diffraction files, permits qualitative identification of the unknown material. Since beta tantalum possesses a unique X-ray diffraction pattern, use of this technique permits positive identification of beta tantalum. X-ray Metallography written by A. Taylor and published in 1961 by John Wiley and Sons, Inc., pp. 154–158 and 160–161, discusses X-ray diffraction patterns and their usefulness as a unique indicia for identifying materials.

Chemical analysis and crystal structure of beta tantalum

As will be discussed in connection with methods for manufacturing beta tantalum films, beta tantalum may be deposited as a result of cathodically sputtering from a cathode of body-centered cubic tantalum, herein referred to as "normal tantalum." Analytic and spectrographic tests comparing films of beta tantalum with films of normal tantalum sputtered from the same normal tantalum cathode indicate beta tantalum films are substantially as pure as normal tantalum films. The crystal structure of beta tantalum, however, is not that of normal tantalum and beta tantalum possesses properties different from those of tantalum.

The following Tables I, II, III, and IV present information comparing beta tantalum and normal tantalum. Tables II and III are based upon measurements of films of beta tantalum and of normal tantalum sputtered from the same cathode of normal tantalum. This cathode was made of metallurgical grade tantalum. Table IV is based upon measurements of fi'ms prepared independently of those films used in Tables II and III.

Table I compares the X-ray diffraction pattern of normal tantalum which has a body-centered cubic crystalline structure with the X-ray diffraction pattern of beta tantalum.

*Table I*

| Beta tantalum, *d*A. | Normal tantalum, *d*A. |
|---|---|
| 5.38 | |
| 4.75 | |
| 2.67 | |
| 2.49 | |
| 2.36 | |
| 2.32 | 2.338 |
| 2.15 | |
| 2.06 | |
| 1.77 | 1.653 |
| 1.442 | |
| 1.405 | |
| 1.332 | 1.350 |
| 1.240 | |
| 1.210 | |
| 1.172 | |
| | 1.0453 |

Table II lists the elements which are not detected by spectrographic analysis in representative samples of either beta tantalum or normal tantalum and are listed with their limits of detection in parts per million.

*Table II*

| | |
|---|---|
| Ag<1 | Mn<5 |
| As<50 | Pb<5 |
| B<5 | Sb<50 |
| Ba<10 | Sn<10 |
| Be<5 | V<10 |
| Bi<5 | W<1000 |
| Cd<5 | Zn<50 |
| Co<10 | Zr<50 |
| Cr<10 | |

Table III lists the impurity elements detected by spectrographic analysis in representative samples of beta tantalum and normal tantalum. Amounts detected are listed in parts per million.

*Table III*

| Normal Tantalum | Beta Tantalum |
|---|---|
| Al 10 | 5 |
| Ca 10 | 5 |
| Cu 1–5 | 1–5 |
| Fe 10–25 | 10 |
| Mg 5 | 5–10 |
| Mo 50 | 50–100 |
| Na<50 | <50 |
| Nb 100–200 | 100–200 |
| Ni <5 | 5–10 |
| Si 10–25 | 10–25 |
| Ti 5–10 | 5–10 |

Table IV lists additional impurity elements found in representative samples of beta tantalum and normal tantalum sputtered from the same metallurgical grade normal tantalum cathode which were detected by xenon flash discharge and gas chromatographic analysis. Amounts are given as the percent of atoms of an impurity element detected, e.g., 1.7% of the atoms in the normal tantalum were argon atoms.

*Table IV*

| Normal Tantalum | Beta Tantalum |
|---|---|
| A 1.7 | 2.1 |
| C 1.2 | 1.1 |
| H 8.0 | 6.9 |
| N 0.17 | <0.07 |

As Tables II, III, and IV illustrate, beta tantalum contains the same impurities in substantially the same amounts as normal tantalum. This is not to say that a material (or materials) has not reacted with normal tantalum to produce a tantalum compound having the crystalline structure of beta tantalum, or that a material (or materials) has not gone into either a substitutional or interstitial solution with normal tantalum which accounts for the difference in crystalline structure between beta tantalum and normal tantalum. In addition, this does not exclude the possibility that some material (or materials) is stabilizing or influencing the formation of beta tantalum. However, comparison of the X-ray diffraction pattern of beta tantalum with the X-ray diffraction pattern of all known tantalum containing materials does not permit identification of beta tantalum as one of these materia!s.

Table V lists all of the *d*-spacings for beta tantalum which have been observed.

*Table V*

[*d*A.]

| | | |
|---|---|---|
| 5.38 | 2.15 | 1.37 |
| 4.75 | 2.06 | 1.332 |
| 2.80 | 1.96 | 1.29 |
| 2.67 | 1.77 | 1.240 |
| 2.62 | 1.59 | 1.210 |
| 2.49 | 1.56 | 1.172 |
| 2.36 | 1.53 | 1.10 |
| 2.32 | 1.46 | 1.03 |
| 2.25 | 1.442 | 1.01 |
| 2.21 | 1.405 | |

The *d*-spacings found in Table V are a compilation of *d*-spacings observed by different techniques. All of the *d*-spacings listed are observable by making direct measurements on films which have been exposed to X-rays difffracted from a sample of beta tantalum. Different techniques can be used in exposing the films from which the direct measurements are made. For example, the sample can be held stationary while the films are exposed or the sample can be osci!lated. A large number of the *d*-spacings listed are obtainable by diffractometer techniques. Studies of beta tantalum by electron difffraction also confirm many of the *d*-spacings recorded in Table V.

In addition to its unique crystal structure, beta tantalum deposited on flat surfaces usually has a distinctive fiber structure. A fiber structure is one in which there is a tendency for a certain crystallographic plane to lie parallel to the surface of the substrate.

Due to such fiber structure, the number of *d*-spacings observed will vary somewhat with the particular technique used. Different equipment, film thickness, and the particular technique used also affect the number of *d*-spacings observed. It should be understood that additional *d*-spacings may be observed when new techniques, bulk material, or single crystals are available.

In Table VI *d*-spacings are listed which are considered to be particularly accurate. These particular *d*-spacings are confirmed by two or more different techniques.

*Table VI*

| | | |
|---|---|---|
| 5.38 | 2.15 | 1.240 |
| 4.75 | 2.06 | 1.210 |
| 2.67 | 1.77 | 1.172 |
| 2.49 | 1.442 | |
| 2.36 | 1.405 | |
| 2.32 | 1.332 | |

Manufacture of beta tantalum

Beta tantalum is readily produced in an in-line, open-ended, vacuum machine of the type disclosed in the copending application of Charschan et al., Ser. No. 314,412 filed Oct. 7, 1963, which is assigned to Western Electric Company, Inc.

This in-line vacuum machine includes a plurality of vacuum chambers which are serially connected. The end chambers are vented to the atmosphere to permit a continuous flow of substrates on which material is to be sputtered to pass through the machine. Substrates introduced at the input end of the machine are carried through successively more highly evacuated chambers, receive a coating of sputtered material in a central sputtering chamber (or chambers), then are carried through successively less highly evacuated chambers to emerge at the output end of the machine. The substrates are individually carried by carriers or boats which are driven through the series of vacuum chambers as discussed above.

The substrates, which may be of conventional glass or ceramic material, and are generally rectangular in shape, are passed through the deposition chamber generally parallel to the cathode at a distance of from 2½ to 3 inches from the cathode. The cathode is also generally rectangular in shape and has a width, i.e., the dimension transverse to the direction of travel of the substrates, from 5 to 6 inches greater than the width of the substrates. The substrates are driven past the cathode in a centered relationship with respect to the width of the cathode so that the cathode extends from 2½ to 3 inches beyond either side of the substrates. In the chambers preceding the deposition chamber the substrates are outgased by preheating in vacuo for ten minutes at a temperature above 300° F.

Sputtering in the deposition chamber is in an argon atmosphere at a pressure of $30\times10^{-3}$ torr. The deposition chamber is pumped down to approximately $2\times10^{-6}$ torr and particular care taken that only argon is introduced into the deposition chamber to bring the pressure up to $30\times10^{-3}$ torr. A potential difference of 4000 volts is maintained between the substrate and cathode which produces a current density in the glow discharge of approximately 3 milliamps per square inch of cathode surface.

Although the sputtering conditions set forth above are preferred for producing beta tantalum in the in-line vacuum machine, it is to be understood that beta tantalum is observed over a range of different sputtering conditions.

An essential step in the manufacture of beta tantalum is the identification of the material. Although the sputtering conditions set out above produce high quality beta tantalum films in the in-line vacuum machine, to optimize such sputtering conditions positive identification of the material produced is essential. The production of beta tantalum can be confirmed by nondestructive specific resistivity measurements of tantalum-deposited substrates. X-ray diffraction techniques permit positive confirmation of the production of beta tantalum.

Properties of beta tantalum

As stated above, comparison of beta tantalum with normal tantalum has not disclosed any gross compositional differences between beta tantalum and normal tantalum. However, beta tantalum does have a number of useful properties not associated with normal tantalum.

For example, the specific resistivity of beta tantalum is almost a magnitude greater than the specific resistivity of normal tantalum. Normal tantalum in bulk form has a specific resistivity of approximately 12 micro ohm-cm. In normal tantalum thin films, the specific resistivity is observed to be somewhat greater than that of bulk tantalum varying between 24–50 micro ohm-cm. Beta tantalum thin films, however, have a specific resistivity of at least 160 micro ohm-cm. For the sputtering condition set forth above, the specific resistivity of beta tantalum lies in the range between 160 micro ohm-cm. to 280 micro ohm-cm. However, much higher values have been observed under different sputtering conditions.

In addition, beta tantalum is observed to have a temperature coefficient of resistance much smaller than that of normal tantalum. Normal tantalum in bulk form has a temperature coefficient of resistance of from +0.0037 to +0.0038 per centigrade degree change in temperature, or in equivalent notation the temperature coefficient varies from +3700 to +3800 parts per million per centigrade degree (p.p.m./° C.). Using the latter notation, normal tantalum thin films have a temperature coefficient of resistance which varies from +500 to +1000 p.p.m./° C. Beta tantalum thin films, however, are observed to have a temperature coefficient of resistance which varies from +100 p.p.m./° C. to −100 p.p.m./° C.

Because of these properties, beta tantalum is useful in the manufacture of thin-film resistors. This may be illustrated by comparing resistance paths of beta tantalum and of normal tantalum. Given the same path geometry, the path of beta tantalum will have a higher resistance value. Viewed another way, a higher degree of miniaturization in a resistor of given resistance value may be achieved by using beta tantalum.

As a result of the low temperature coefficient of resistivity, resistance paths made of beta tantalum are more temperature stable than resistors of normal tantalum. For example, a 100 ohm, beta tantalum, thin-film resistor will experience a maximum change in resistance of approximately 1 ohm with a 100° C. change in temperature. In contrast, a 100 ohm, normal tantalum, thin-film resistor will experience a minimum change in resistance of approximately 5 ohms with a 100° C. change in temperature.

Comparison of tantalum oxide dielectric, thin-film capacitors manufactured from normal tantalum with identically constructed thin-film capacitors manufactured from beta tantalum, reveals that beta tantalum capacitors are superior to normal tantalum capacitors. This comparison is made with respect to tantalum oxide dielectric, thin-film capacitors constructed with a tantalum thin-film electrode, a tantalum oxide thin-film dielectric, and a gold counterelectrode.

In the communications industry, a useful criterion in meeting circuit requirements for capacitors is that capacitors have leakage currents of less than $10^{-9}$ amperes. Thin film, tantalum oxide dielectric capacitors having an electrode of normal tantalum are not able to consistently meet these leakage current requirements while such capacitors having an electrode of beta tantalum readily meet them.

Life tests conducted on such beta tantalum, thin-film capacitors for 1000 hours at a potential of 50 volts and at a temperature of 85° C. have shown typical changes in capacitance of +0.00014 microfarad and 95% of such capacitors have leakage values of less than $10^{-9}$ amperes. Thus, beta tantalum is particularly useful in producing thin-film capacitors of improved leakage current characteristics and improved stability over long life periods.

As beta tantalum has application as a resistor and as a capacitor it is suited for integrated circuits where capacitors and resistors are formed on the same substrate. Such circuits can be advantageously manufactured from beta tantalum by using a single beta tantalum thin film to form the thin-film resistors and the tantalum, thin-film, capacitor electrodes. In this manner, capacitors and resistors are interconnected by a single continuous thin film to substantially reduce the number of required lead connections, thereby inherently interconnecting highly reliable and stable circuit components to produce improved electronic systems.

What is claimed is:

1. A composition of matter comprising beta tantalum.

2. A composition of matter comprising tantalum, characterized by the following *d*-spacings in angstrom units: 5.38, 4.75, 2.67, 2.49, 2.36, 2.32, 2.15, 2.06, 1.77, 1.442, 1.405, 1.332, 1.240, 1.210, and 1.172.

3. A composition of matter comprising tantalum having a specific resistivity of at least 160 micro ohm-cm. and a temperature coefficient of resistance of from +100 p.p.m./° C. to −100 p.p.m./° C.

4. A composition of matter comprising tantalum, characterized by the following *d*-spacings in angstrom units: 5.38, 4.75, 2.80, 2.67, 2.62, 2.49, 2.36, 2.32, 2.25, 2.21, 2.15, 2.06, 1.96, 1.77, 1.59, 1.56, 1.53, 1.46, 1.442, 1.405, 1.37, 1.332, 1.29, 1.240, 1.210, 1.172, 1.10, 1.03, and 1.01.

5. A composition of matter comprising tantalum having a specific resistivity of at least 160 micro ohm–cm., a temperature coefficient of resistivity of from +100 p.p.m./° C. to −100 p.p.m./° C., and exhibiting the following *d*-spacings in angstrom units: 5.38, 4.75, 2.67, 2.49, 2.36, 2.32, 2.15, 2.06, 1.77, 1.442, 1.405, 1.332, 1.240, 1.210, and 1.172.

6. A composition of matter comprising tantalum having a specific resistivity of at least 160 micro ohm-cm., a temperature coefficient of resistivity of from +100 p.p.m./° C. to −100 p.p.m./° C., and exhibiting the following *d*-spacings in angstrom units: 5.38, 4.75, 2.80, 2.67, 2.62, 2.49, 2.36, 2.32, 2.25, 2.21, 2.15, 2.06, 1.96, 1.77, 1.59, 1.56, 1.53, 1.46, 1.442, 1.405, 1.37, 1.332, 1.29, 1.240, 1.210, 1.172, 1.10, 1.03, and 1.01.

7. An article of manufacture comprising a substrate having a film of beta tantalum thereon.

8. An article of manufacture comprising a tantalum film formed on a substrate, the tantalum film characterized by the following *d*-spacings in angstrom units: 5.38, 4.75, 2.67, 2.49, 2.36, 2.32, 2.15, 2.06, 1.77, 1.442, 1.405, 1.332, 1.240, 1.210, and 1.172.

9. An article of manufacture comprising a tantalum film formed on a substrate, the tantalum film characterized by the following *d*-spacings in angstrom units: 5.38, 4.75, 2.80, 2.67, 2.62, 2.49, 2.36, 2.32, 2,25, 2.21, 2.15, 2.06, 1.96, 1.77, 1.59, 1.56, 1.53, 1.46, 1.442, 1.405, 1.37 1.332, 1.29, 1.240, 1.210, 1.172, 1.10, 1.03, and 1.01.

10. An article of manufacture comprising a tantalum film formed on a substrate, the tantalum film having substantially the same gross composition as normal tantalum and characterized by a specific resistivity of at least 160 micro ohm-cm. and a temperature coefficient of resistivity of from +100 p.p.m./° C. to −100 p.p.m./° C.

11. An article of manufacture wherein a tantalum film is formed on a substrate, the tantalum film having substantially the same gross composition as normal tantalum and having a specific resistivity of at least 160 micro ohm-cm., a temperature coefficient of resistivity of from +100 p.p.m./° C. to −100 p.p.m./° C., and exhibiting the following *d*-spacings in angstrom units: 5.38, 4.75, 2.67, 2.49, 2.36, 2.32, 2.15, 2.06, 1.77, 1.442, 1.405, 1.332, 1.240, 1.210, and 1.172.

12. An article of manufacture wherein a tantalum film is formed on a substrate, the tantalum film having substantially the same gross compositions as normal tantalum and having a specific resistivity of at least 160 micro ohm-cm., a temperature coefficient of from +100 p.p.m./° C. to −100 p.p.m./° C., and exhibiting the following *d*-spacings in angstrom units: 5.38, 4.75, 2.80, 2.67, 2.62, 2.49, 2.36, 2.32, 2.25, 2.21, 2.15, 2.06, 1.96, 1.77, 1.59, 1.56, 1.53, 1.46, 1.442, 1.405, 1.37, 1.332, 1.29, 1.240, 1.210, 1.172, 1.10, 1.03, and 1.01.

References Cited

UNITED STATES PATENTS 3,275,915 9/1966 Harendza-Harinxma -- 317—258

RICHARD M. WOOD, *Primary Examiner.*

J. G. SMITH, *Assistant Examiner.*